United States Patent
Mimura et al.

(10) Patent No.: US 6,236,690 B1
(45) Date of Patent: May 22, 2001

(54) DIRECT-CONVERSION RECEIVER FOR DIGITAL-MODULATION SIGNAL

(75) Inventors: Masahiro Mimura; Makoto Hasegawa, both of Tokyo; Katsushi Yokozaki, Kanagawa-ken; Hiroyuki Harada, Kanazawa; Takaaki Kishigami; Yasunari Tanaka, both of Kanagawa-ken, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/332,078

(22) Filed: Jun. 14, 1999

Related U.S. Application Data

(60) Continuation of application No. 08/778,805, filed on Jan. 3, 1997, which is a division of application No. 08/302,982, filed on Sep. 12, 1994, now Pat. No. 5,617,451.

(30) Foreign Application Priority Data

| Sep. 13, 1993 | (JP) | 5-226953 |
| Sep. 13, 1993 | (JP) | 5-226954 |
| Feb. 21, 1994 | (JP) | 6-22273 |

(51) Int. Cl.7 .............. H04L 27/14; H04L 27/22
(52) U.S. Cl. ............ 375/334; 375/332; 329/300; 329/304; 455/323
(58) Field of Search .................. 375/272–273, 375/275, 279, 280–281, 283, 316, 324–325, 329–332, 334, 335, 344, 345; 329/300–310; 455/323

(56) References Cited

U.S. PATENT DOCUMENTS

| 5,086,437 |   | 2/1992  | Tomita . |
| 5,131,014 | * | 7/1992  | White ................... 375/373 |
| 5,402,449 |   | 3/1995  | Schultes et al. . |
| 5,446,762 | * | 8/1995  | Ohba et al. ............. 375/324 |
| 5,535,252 | * | 7/1996  | Kobayashi ............ 375/371 |
| 5,550,867 | * | 8/1996  | Yamamoto et al. ........ 375/324 |
| 5,588,026 | * | 12/1996 | Ishikawa et al. ......... 375/329 |
| 5,781,588 | * | 7/1998  | Abe et al. ............ 375/334 |
| 5,870,669 | * | 2/1999  | Kawai ................ 455/209 |
| 5,960,042 | * | 9/1999  | Chang et al. ........... 375/293 |

* cited by examiner

Primary Examiner—Young T. Tse
(74) Attorney, Agent, or Firm—Louis Woo

(57) ABSTRACT

A direct-conversion receiver includes a local oscillator for generating a local oscillator signal, a converter circuit for converting a received radio signal into a pair of a baseband I signal and a baseband Q signal in response to the local oscillator signal, a demodulator for demodulating the pair of the baseband I signal and the baseband Q signal into a demodulation-resultant signal which is neither an I signal nor a Q signal, a detector circuit for detecting a difference between a frequency of the local oscillator signal and a frequency of a carrier of the received radio signal, a clock signal generator for generating a first clock signal providing a timing which corresponds to a center of a symbol period, a signal delay device for delaying the first clock signal to provide a second clock signal, and a symbol deciding circuit for deciding a logic state of the demodulation-resultant signal at a timing determined by the second clock signal.

2 Claims, 11 Drawing Sheets

PRIOR ART

DIRECT-CONVERSION RECEIVER FOR DIGITAL-MODULATION SIGNAL

CROSS-REFERENCES TO RELATED APPLICATIONS

This is a continuation of U.S. patent application, Ser. No. 08/778,805, filed on Jan. 3, 1997 which is a division of U.S. patent application, Ser. No. 08/302,982, filed on Sep. 12, 1994 and now issued as U.S. Pat. No. 5,617,451.

BACKGROUND OF THE INVENTION

1. Field of the Invention

This invention relates to a direct-conversion receiver for a digital-modulation radio signal such as a frequency shift keyed (FSK) signal.

2. Description of the Prior Art

Paging systems of a mobile radio communications network are used for one-way signaling to small receivers (pagers) carried out by individuals. This paging function can signal an individual selectively to take some prearranged action, e.g., call the office, or can deliver a short message. In some of paging systems, a transmitter of a base station can communicate with pagers via digital-modulation radio signals such as frequency shift keyed (FSK) signals.

Direct-conversion receivers can be used as pagers containing FSK demodulators. According to some of the signal transmission standards for a paging system, a base station periodically transmits a digital-modulation radio signal a predetermined number of times, for example, three times. Thus, a pager generally receives a digital-modulation signal the predetermined number of times. The pager selects and uses only one of the first received signal to the last received signal, and disregards the other signals.

U.S. Pat. No. 5,402,449 discloses sample and hold circuits which periodically sample I and Q signals in response to a system clock outputted from a clock signal generator. In U.S. Pat. No. 5,402,449, the sample and hold circuits are successively followed by analog-to-digital converters, a ROM, and a decoder. The decoder includes a latch for periodically sampling and holding a decoding result in response to a data clock. U.S. Pat. No. 5,402,449 does not disclose deciding a logic state of the decoding result at a timing determined by a clock signal which is delayed from a center-symbol clock signal by a specified time. U.S. Pat. No. 5,402,449 does not disclose deciding a logic state of the decoding result at a timing which depends on a frequency error between a local oscillator signal and a received signal.

U.S. Pat. No. 5,086,437 discloses a frequency detector for demodulating a pair of I and Q signals into a digital baseband signal. The frequency detector is followed by a digital data detector which generates a data signal from the digital baseband signal. U.S. Pat. No. 5,086,437 does not disclose deciding a logic state of the data signal (the detection result) at a timing determined by a clock signal which is delayed from a center-symbol clock signal by a specified time. U.S. Pat. No. 5,086,437 does not disclose deciding a logic state of the data signal (the detection result) at a timing which depends on a frequency error between a local oscillator signal and a received signal.

SUMMARY OF THE INVENTION

It is an object of this invention to provide an improved direct-conversion receiver for a digital-modulation signal.

A first aspect of this invention provides a direct-conversion receiver comprising a direct-conversion demodulator; first means for detecting a strength of a received signal; a clock signal generator for generating a clock signal in response to a reception start signal, the clock signal having a frequency corresponding to a symbol rate or higher; second means for sampling an output signal of the demodulator at a timing determined by the clock signal; third means for sampling an output signal of the first means at a timing determined by the clock signal; fourth means for storing "n" output signals of the second means which relate to a signal periodically transmitted from a transmitting station "n" times, wherein "n" denotes a natural number equal to 2 or greater; fifth means for storing "n" output signals of the third means which correspond in timing to the "n" output signals of the second means; sixth means for reading out signals from the fourth means and reading out signals from the fifth means, and for weighing the signals read out from the fourth means in response to the signals read out from the fifth means; and seventh means for combining output signals of the sixth means.

A second aspect of this invention provides a direct-conversion receiver comprising a direct-conversion demodulator; first means for sampling an output signal of the demodulator; second means for storing "n" output signals of the first means which relate to a signal periodically transmitted from a transmitting station "n" times, wherein "n" denotes a natural number equal to 2 or greater; and third means for reading out signals from the second means, and for combining the signals read out from the second means.

A third aspect of this invention provides a direct-conversion receiver comprising a direct-conversion demodulator; first means for detecting a strength of a received signal; second means for sampling an output signal of the demodulator; third means for sampling an output signal of the first means; fourth means for storing "n" output signals of the second means which relate to a signal periodically transmitted from a transmitting station "n" times, wherein "n" denotes a natural number equal to 2 or greater; fifth means for storing "n" output signals of the third means which correspond in timing to the "n" output signals of the second means; sixth means for reading out signals from the fourth means and reading out signals from the fifth means, and for weighing the signals read out from the fourth means in response to the signals read out from the fifth means; and seventh means for combining output signals of the sixth means.

A fourth aspect of this invention provides a direct-conversion receiver comprising a direct-conversion demodulator; first means for detecting a strength of a received signal; a clock signal generator for generating a clock signal in response to a reception start signal, the clock signal having a frequency corresponding to a symbol rate or higher; second means for sampling an output signal of the demodulator at a timing determined by the clock signal; third means for sampling an output signal of the first means at a timing determined by the clock signal; fourth means for weighting an output signal of the second means in response to an output signal of the third means; a memory; an adder for adding an output signal of the memory and an output signal of the fourth means; fifth means for storing an output signal of the adder into the memory, wherein results of the weighting of "n" output signals of the second means which relate to a signal periodically transmitted from a transmitting station "n" times are present in the memory at a final stage, wherein "n" denotes a natural number equal to 2 or greater; and sixth means for reading out signals representative of the results of the weighting from the memory.

A fifth aspect of this invention provides a direct-conversion receiver comprising a direct-conversion demodulator; first means for sampling an output signal of the demodulator; a memory; an adder for adding an output signal of the memory and an output signal of the first means; second means for storing an output signal of the adder into the memory, wherein results of the adding of "n" output signals of the first means which relate to a signal periodically transmitted from a transmitting station "n" times are present in the memory at a final stage, wherein "n" denotes a natural number equal to 2 or greater; and third means for reading out signals representative of the results of the adding from the memory.

A sixth aspect of this invention provides a direct-conversion receiver comprising a direct-conversion demodulator; first means for detecting a strength of a received signal; second means for sampling an output signal of the demodulator; third means for sampling an output signal of the first means; fourth means for weighting an output signal of the second means in response to an output signal of the third means; a memory; an adder for adding an output signal of the memory and an output signal of the fourth means; fifth means for storing an output signal of the adder into the memory, wherein results of the weighting of "n" output signals of the second means which relate to a signal periodically transmitted from a transmitting station "n" times are present in the memory at a final stage, wherein "n" denotes a natural number equal to 2 or greater; and sixth means for reading out signals representative of the results of the weighting from the memory.

A seventh aspect of this invention provides a direct-conversion receiver for sequentially-transmitted first and second radio signals carrying first information and second information respectively, the first information and the second information being equal in contents, the receiver comprising first means for receiving the first and second radio signals; a local oscillator outputting a signal having a frequency equal to a frequency of carriers of the first and second radio signals; a mixer for mixing the first and second radio signals received by the first means and the output signal of the local oscillator, and down-converting the first and second radio signals into first and second baseband signals representing the first information and the second information respectively; second means for detecting strengths of the first and second radio signals received by the first means; third means for weighting the first and second baseband signals in response to the detected strengths of the first and second radio signals, and thereby converting the first and second baseband signals into first and second weighted baseband signals respectively; and fourth means for combining the first and second weighted baseband signals into a composite baseband signal.

An eighth aspect of this invention provides a direct-conversion receiver comprising a direct-conversion demodulator; a clock signal generator for generating a first clock signal providing a timing which corresponds to a center of a symbol period; a signal delay device for delaying the first clock signal by a time equal to or shorter than a half of a symbol period, and thereby converting the first clock signal into a second clock signal; and means for deciding a logic state of an output signal of the demodulator at a timing determined by the second clock signal.

A ninth aspect of this invention provides a direct-conversion receiver comprising a direct-conversion demodulator having a local oscillator; means for detecting a difference between an oscillation frequency of the local oscillator and a frequency of a carrier of a received radio signal; a clock signal generator for generating a first clock signal providing a timing which corresponds to a center of a symbol period; a signal delay device for delaying the first clock signal in response to the detected frequency difference, and thereby converting the first clock signal into a second clock signal; and means for deciding a logic state of an output signal of the demodulator at a timing determined by the second clock signal.

A tenth aspect of this invention provides a direct-conversion receiver comprising a direct-conversion demodulator; a signal processor; means for generating a first clock signal; means for generating a second clock signal which is different from the first clock signal in timing; means for deciding a logic state of an output signal of the demodulator at a timing determined by the first clock signal; and means for starting execution of a program segment by the signal processor at a timing determined by the second clock signal, wherein said execution of the program segment by the signal processor tends to cause noise.

An eleventh aspect of this invention provides a direct-conversion receiver for a radio signal carrying information which comprises first means for receiving the radio signal; a local oscillator outputting a signal having a frequency which is designed to correspond to a frequency of a carrier of the radio signal; a mixer for mixing the radio signal received by the first means and the output signal of the local oscillator, and down-converting the radio signal into a baseband signal representing the information; second means for detecting a difference between the frequency of the output signal of the local oscillator and the frequency of the carrier of the radio signal received by the first means; and third means for deciding a logic state of the baseband signal at a timing which depends on the frequency difference detected by the second means.

A twelfth aspect of this invention provides a direct-conversion receiver comprising a direct-conversion demodulator for demodulating a radio signal into baseband I and Q signals; a plurality of voltage comparators for comparing the baseband I signal with different threshold levels respectively, and outputting first comparison-result signals representing results of said comparing respectively; a plurality of voltage comparators for comparing the baseband Q signal with different threshold levels respectively, and outputting second comparison-result signals representing results of said comparing respectively; and means for deriving a composite baseband signal from the first comparison-result signals and the second comparison-result signals.

A thirteenth aspect of this invention provides a direct-conversion receiver comprising a direct-conversion demodulator for demodulating a radio signal into baseband I and Q signals; a plurality of voltage comparators for comparing the baseband I signal with different threshold levels respectively, and outputting first comparison-result signals representing results of said comparing respectively; means for detecting level changes in the first comparison-result signals, and outputting first level-change signals representative thereof; a plurality of voltage comparators for comparing the baseband Q signal with different threshold levels respectively, and outputting second comparison-result signals representing results of said comparing respectively; means for detecting level changes in the second comparison-result signals, and outputting second level-change signals representative thereof; and means for generating a composite baseband signal in response to the first level-change signals and the second level-change signals.

DESCRIPTION OF THE PREFERRED EMBODIMENTS

First Embodiment

Figure 1:
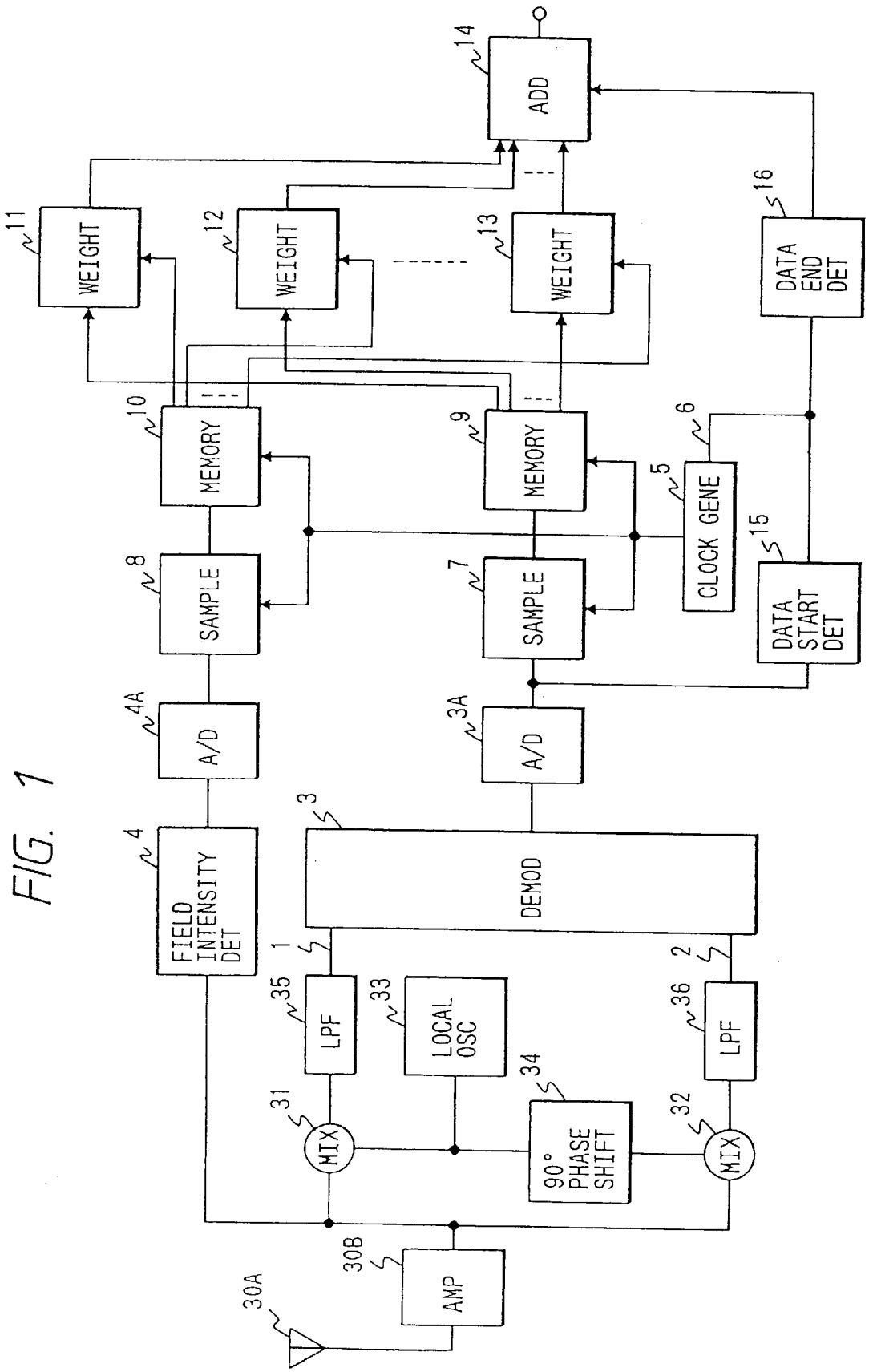
FIG. 1 is a block diagram of a direct-conversion receiver according to a first embodiment of this invention.

With reference to FIG. 1, a direct-conversion receiver of a first embodiment of this invention includes an antenna 30A for catching an FSK radio signal. The antenna 30A is followed by an RF amplifier 30B. The received FSK radio signal is fed from the antenna 30A to mixers 31 and 32 and a field intensity detector 4 via the amplifier 30B.

A local oscillator 33 outputs a signal having a frequency set to the frequency of a carrier of an FSK radio signal. The output signal of the local oscillator 33 is applied to the mixer 31. The output signal of the local oscillator 33 is also applied to a 90° phase shifter 34, being converted thereby into a 90° phase shifted signal. Thus, the output signal of the local oscillator 33 and the output signal of the 90° phase shifter 34 have a quadrature relationship with each other. The output signal of the 90° phase shifter 34 is applied to the mixer 32.

The mixer 31 down-converts the received FSK radio signal in response to the output signal of the local oscillator 33. The output signal of the mixer 31 is processed by a low pass filter 35, being converted thereby into a baseband I (in-phase) signal 1.

The mixer 32 down-converts the received FSK radio signal in response to the output signal of the 90° phase shifter 34. The output signal of the mixer 32 is processed by a low pass filter 36, being converted thereby into a baseband Q (quadrature) signal 2. The baseband I signal 1 and the baseband Q signal 2 have a quadrature relationship with each other.

A demodulator 3 receives the baseband I signal 1 and the baseband Q signal 2 from the low pass filters 35 and 36 respectively. The demodulator 3 combines the baseband I signal 1 and the baseband Q signal 2 into an analog baseband signal (one of an analog signal, a not-full-digital signal, and a quasi digital signal) representing transmission data carried by the received FSK radio signal. The demodulator 3 outputs the analog baseband signal to an A/D converter or a wave shaper 3A. The analog baseband signal is converted by the device 3A into a corresponding digital baseband signal. The digital baseband signal represents whether the received FSK radio signal corresponds to "mark" or "space", that is, "1" or "0".

In general, a base station transmits an FSK radio signal a predetermined number of times, for example, three times. The FSK radio signal has a sequence of a preamble signal and a data signal. Accordingly, the A/D converter 3A outputs a digital baseband signal in response to each of the first received FSK radio signal to the last received FSK radio signal. The first digital baseband signal to the last digital baseband signal are now defined as corresponding to the first received FSK radio signal to the last received FSK radio signal respectively.

A data start detector 15 sequentially receives the digital baseband signals from the A/D converter 3A. The data start detector 15 detects the preamble signal in each of the digital baseband signals, and generates a decoding start pulse signal 6 in response to the detected preamble signal. The decoding start pulse signal 6 occurs at a moment corresponding to the start of the data signal in each of the digital baseband signals.

A clock signal generator 5 receives the decoding start pulse signal 6 from the data start detector 15, and starts to produce a clock signal in response to the decoding start pulse signal 6. The clock signal has a frequency corresponding to the symbol rate or the bit rate of the received FSK radio signal. The clock signal may have a frequency corresponding to higher than the symbol rate or the bit rate of the received FSK radio signal.

A sampling device 7 receives the clock signal from the clock signal generator 5. The sampling device 7 sequentially receives the digital baseband signals from the A/D converter 3A, and periodically samples each of the digital baseband signals at a timing determined by the clock signal. The signals sampled by the device 7 represent the states of the symbols or the bits of the data signal in each of the digital baseband signals.

The sampling device 7 is followed by a memory 9 which receives the clock signal from the clock signal generator 5. The signals sampled by the device 7 are sequentially stored into the memory 9 in response to the clock signal. As a result, the sampled data signals (the samples of the data signals) in the first digital baseband signal to the last digital baseband signal are held in the memory 9. The sampled data signals in the first digital baseband signal to the last digital baseband signal are read out from the memory 9, being fed to weighting devices (for example, weighting devices 11, 12, and 13) respectively.

Specifically, during a first period, the sampled data signals in first symbol places (first bit places) of the first digital baseband signal to the last digital baseband signal are transferred from the memory 9 to the weighting devices (for example, the weighting devices 11, 12, and 13) respectively. During a second period, the sampled data signals in second symbol places (second bit places) of the first digital baseband signal to the last digital baseband signal are transferred from the memory 9 to the weighting devices (for example, the weighting devices 11, 12, and 13) respectively. Such signal transfer processes are repeated in respect of third and later symbol places (third and later bit places). Finally, the sampled data signals in end symbol places (end bit places)

of the first digital baseband signal to the last digital baseband signal are transferred from the memory 9 to the weighting devices (for example, the weighting devices 11, 12, and 13) respectively.

The field intensity detector 4 senses the field intensity (the signal strength or the carrier level) of the currently-received FSK radio signal by referring to the output signal of the amplifier 30B. The field intensity detector 4 outputs an analog signal representing the detected field intensity of the currently-received FSK radio signal.

An A/D converter 4A following the field intensity detector 4 converts the output signal of the field intensity detector 4 into a corresponding digital signal which represents the detected field intensity of the currently-received FSK radio signal.

A sampling device 8 receives the clock signal from the clock signal generator 5. The sampling device 8 receives the field-intensity digital signal from the A/D converter 4A, and periodically samples the field-intensity digital signal at a timing determined by the clock signal. The signal samples provided by the sampling device 8 represent the field intensities which occur at moments corresponding to the symbols or the bits of the data signals in the first received FSK radio signal to the last received FSK radio signal.

The sampling device 8 is followed by a memory 10 which receives the clock signal from the clock signal generator 5. The signal samples provided by the device 8 are sequentially stored into the memory 10 in response to the clock signal. As a result, the signal samples representing the field intensities corresponding to the symbols or the bits of the data signals in the first received FSK radio signal to the last received FSK radio signal are held in the memory 10. The field-intensity signal samples are read out from the memory 10, being fed to the weighting devices (for example, weighting devices 11, 12, and 13) respectively.

Specifically, during a first period, the signal samples representing the field intensities corresponding to first symbols (first bits) of the data signals in the first received FSK radio signal to the last received FSK radio signal are transferred from the memory 10 to the weighting devices (for example, the weighting devices 11, 12, and 13) respectively. During a second period, the signal samples representing the field intensities corresponding to second symbols (second bits) of the data signals in the first received FSK radio signal to the last received FSK radio signal are transferred from the memory 10 to the weighting devices (for example, the weighting devices 11, 12, and 13) respectively. Such signal transfer processes are repeated in respect of third and later symbols (third and later bits). Finally, the signal samples representing the field intensities corresponding to end symbols (end bits) of the data signals in the first received FSK radio signal to the last received FSK radio signal are transferred from the memory 10 to the weighting devices (for example, the weighting devices 11, 12, and 13) respectively.

The weighting devices (for example, the weighting devices 11, 12, and 13) uses the field-intensity signal samples as weight coefficients respectively. A greater weight coefficient is provided as the field intensity represented by a signal sample increases. The weighting devices (for example, the weighting devices 11, 12, and 13) include multipliers respectively.

During a first period, the first weighting device (for example, the weighting device 11) multiplies the sample of the first symbol (the first bit) of the data signal in the first digital baseband signal by the corresponding weight coefficient, and outputs a signal representing a result of the multiplication. In addition, the second weighting device (for example, the weighting device 12) multiplies the sample of the first symbol (the first bit) of the data signal in the second digital baseband signal by the corresponding weight coefficient, and outputs a signal representing a result of the multiplication. Other weighting devices execute similar multiplying processes. The last weighting device (for example, the weighting device 13) multiplies the sample of the first symbol (the first bit) of the data signal in the last digital baseband signal by the corresponding weight coefficient, and outputs a signal representing a result of the multiplication. An adder 14 following the weighting devices (for example, the weighting devices 11, 12, and 13) combines their output signals into a final demodulation-result signal representing the state of the first symbol (the first bit) of the periodically-transmitted data signal.

During a second period, the first weighting device (for example, the weighting device 11) multiplies the sample of the second symbol (the second bit) of the data signal in the first digital baseband signal by the corresponding weight coefficient, and outputs a signal representing a result of the multiplication. In addition, the second weighting device (for example, the weighting device 12) multiplies the sample of the second symbol (the second bit) of the data signal in the second digital baseband signal by the corresponding weight coefficient, and outputs a signal representing a result of the multiplication. Other weighting devices execute similar multiplying processes. The last weighting device (for example, the weighting device 13) multiplies the sample of the second symbol (the second bit) of the data signal in the last digital baseband signal by the corresponding weight coefficient, and outputs a signal representing a result of the multiplication. The adder 14 combines the output signals of the weighting devices (for example, the weighting devices 11, 12, and 13) into a final demodulation-result signal representing the state of the second symbol (the second bit) of the periodically-transmitted data signal.

During later periods, similar processes are executed regarding the third and later symbols (the third and later bits) of the data signals in the first digital baseband signal to the last digital baseband signal. Accordingly, the adder 14 generates a final demodulation-result signal which sequentially represents the states of the third and later symbols (the third and later bits) of the periodically-transmitted data signal.

During a final period, the first weighting device (for example, the weighting device 11) multiplies the sample of the end symbol (the end bit) of the data signal in the first digital baseband signal by the corresponding weight coefficient, and outputs a signal representing a result of the multiplication. In addition, the second weighting device (for example, the weighting device 12) multiplies the sample of the end symbol (the end bit) of the data signal in the second digital baseband signal by the corresponding weight coefficient, and outputs a signal representing a result of the multiplication. Other weighting devices execute similar multiplying processes. The last weighting device (for example, the weighting device 13) multiplies the sample of the end symbol (the end bit) of the data signal in the last digital baseband signal by the corresponding weight coefficient, and outputs a signal representing a result of the multiplication. The adder 14 combines the output signals of the weighting devices (for example, the weighting devices 11, 12, and 13) into a final demodulation-result signal representing the state of the end symbol (the end bit) of the periodically-transmitted data signal.

A data end detector 16 receives decoding start pulse signals 6 from the data start detector 15. The data end detector 16 includes a combination of a counter and a signal delay circuit. The data end detector 16 counts the number of the received decoding start pulse signals 6, and detects a time of the occurrence of the last data signal. When the last data signal terminates, the data end detector 16 outputs a pulse signal to the adder 14 to start the operation thereof.

The direct-conversion receiver of this embodiment may be modified into a design including analog circuits only.

The field intensity detector 4 may use a signal-strength sensing portion in an AGC circuit.

Second Embodiment

Figure 2:
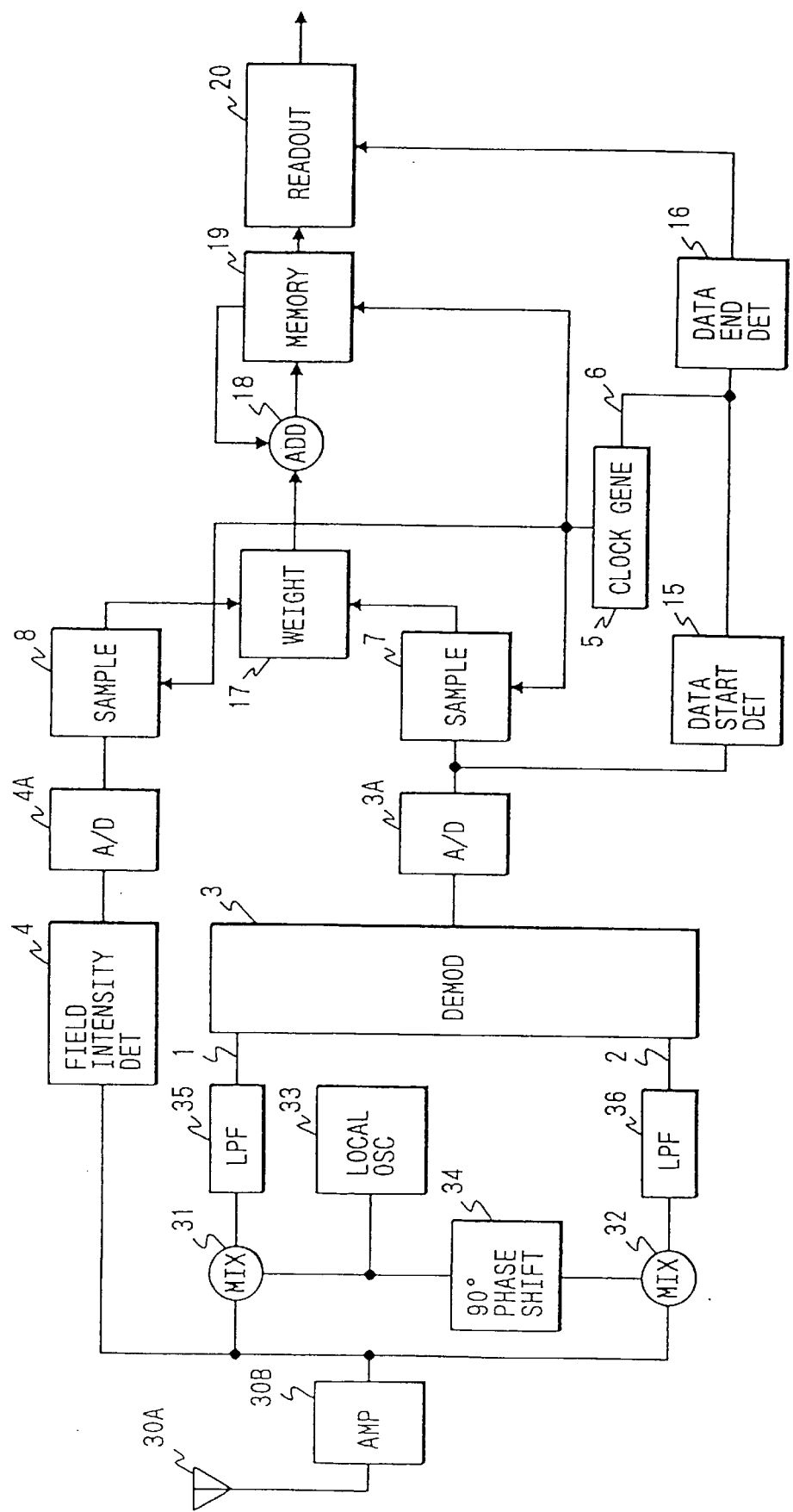
FIG. 2 is a block diagram of a direct-conversion receiver according to a second embodiment of this invention.

FIG. 2 shows a direct-conversion receiver according to a second embodiment of this invention which is similar to the embodiment of FIG. 1 except for design changes indicated hereinafter.

The direct-conversion receiver of FIG. 2 includes a weighting device 17 containing a multiplier. The weighting device 17 receives an output signal of a sampling device 7 which sequentially represents the samples of symbols (bits) of first to last data signals. The weighting device 17 also receives an output signal of a sampling device 8 which sequentially represents field intensities corresponding to symbols (bits) of first to last data signals respectively. In the weighting device 17, the field intensities are used as weight coefficients. For each of the symbols (the bits) of the first to the last data signals, the weighting device 17 multiplies the sample of the symbol by the corresponding weight coefficient to generate a weighting-resultant symbol sample (a weighting-resultant bit sample).

An adder 18 receives the weighting-resultant signal from the weighting device 17. The adder 18 is connected to a memory 19 containing, for example, a shift register. The memory 19 operates in response to a clock signal outputted from a clock signal generator 5.

During a first period where the weighting-resultant signal outputted from the weighting device 17 relates to the first data signal, the symbol samples represented by the weighting-resultant signal are passed through the adder 18 and are sequentially written into the memory 19.

During a second period where the weighting-resultant signal outputted from the weighting device 17 relates to the second data signal, the weighting-resultant signal relating to the first data signal is transferred from the memory 19 to the adder 18 so that the weighting-resultant signal relating to the first data signal and the weighting-resultant signal relating to the second data signal are combined by the device 18 into a first addition-resultant signal symbol by symbol (bit by bit). The first addition-resultant signal is written into the memory 19.

During a third period where the weighting-resultant signal outputted from the weighting device 17 relates to the third data signal, the first addition-resultant signal relating to the first and second data signals is transferred from the memory 19 to the adder 18 so that the first addition-resultant signal relating to the first and second data signals and the weighting-resultant signal relating to the third data signal are combined by the device 18 into a second addition-resultant signal symbol by symbol (bit by bit). The second addition-resultant signal is written into the memory 19.

During each of a fourth and later periods, similar processes are executed so that each of a third and later addition-resultant signals is written into the memory 19.

During a final period where the weighting-resultant signal outputted from the weighting device 17 relates to the last data signal, the addition-resultant signal relating to the first and later data signals except the last data signal is transferred from the memory 19 to the adder 18 so that the addition-resultant signal relating to the first and later data signals and the weighting-resultant signal relating to the last data signal are combined by the device 18 into a final addition-resultant signal symbol by symbol (bit by bit). The final addition-resultant signal is written into the memory 19.

A readout device 20 connected to the memory 19 reads out the final addition-resultant signal from the memory 19 symbol by symbol (bit by bit) as a final demodulation-result signal. The readout device 20 is connected to a data end detector 16. When the last data signal terminates, the data end detector 16 outputs a pulse signal to the readout device 20 to start the operation thereof.

The direct-conversion receiver of this embodiment may be modified into a design including analog circuits only.

A field intensity detector 4 may use a signal-strength sensing portion in an AGC circuit.

Third Embodiment

Figure 3:
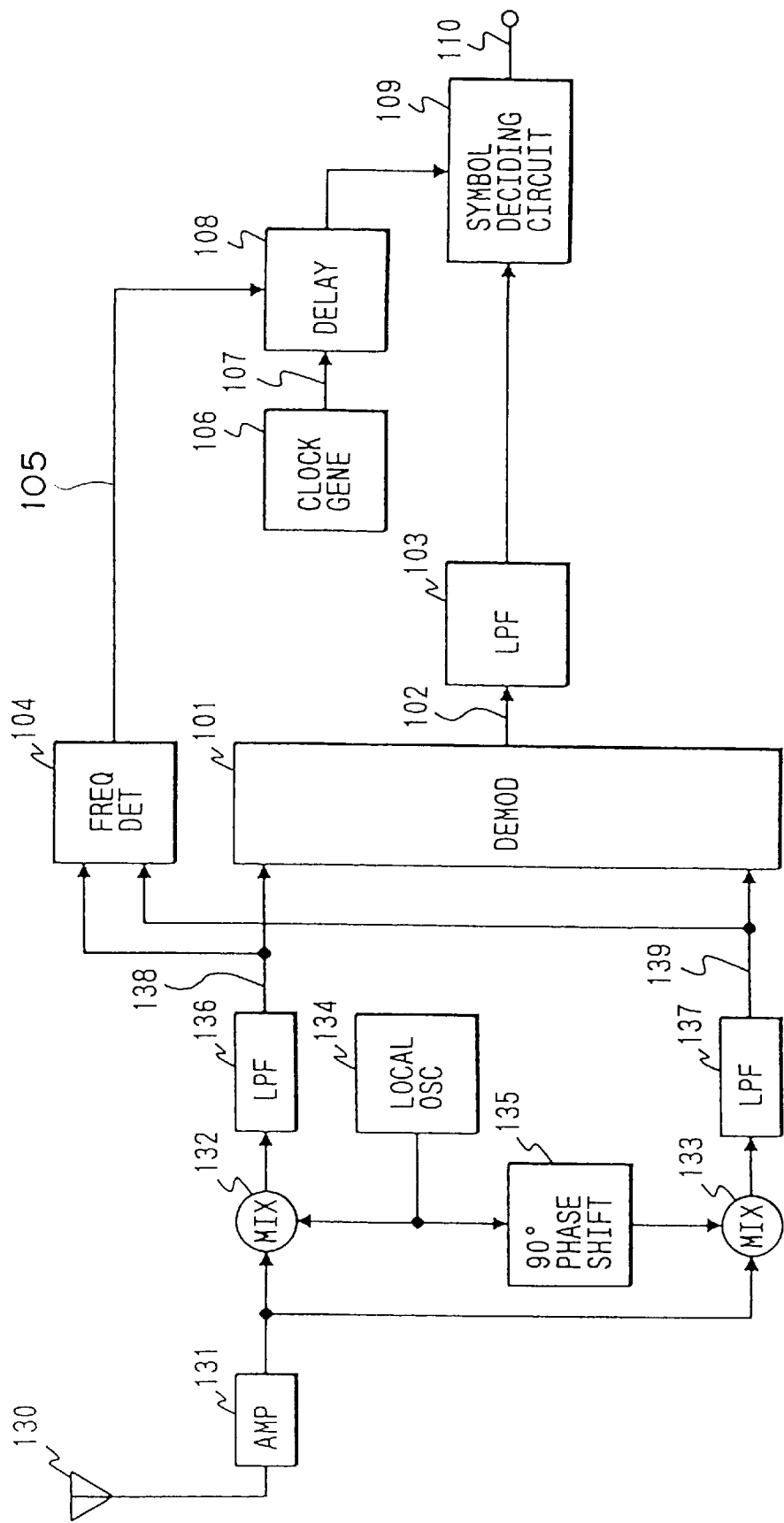
FIG. 3 is a block diagram of a direct-conversion receiver according to a third embodiment of this invention.

With reference to FIG. 3, a direct-conversion receiver of a third embodiment of this invention includes an antenna 130 for catching an FSK radio signal. The antennal 130 is followed by an RF amplifier 131. The received FSK radio signal is fed from the antenna 131 to mixers 132 and 133 via the amplifier 131.

A local oscillator 134 outputs a signal having a frequency set to the frequency of a carrier of an FSK radio signal. The output signal of the local oscillator 134 is applied to the mixer 132. The output signal of the local oscillator 134 is also applied to a 90° phase shifter 135, being converted thereby into a 90° phase shifted signal. Thus, the output signal of the local oscillator 134 and the output signal of the 90° phase shifter 135 have a quadrature relationship with each other. The output signal of the 90° phase shifter 135 is applied to the mixer 133.

The mixer 132 down-converts the received FSK radio signal in response to the output signal of the local oscillator 134. The output signal of the mixer 132 is processed by a low pass filter 136, being converted thereby into a baseband I (in-phase) signal 138.

The mixer 133 down-converts the received FSK radio signal in response to the output signal of the 90° phase shifter 135. The output signal of the mixer 133 is processed by a low pass filter 137, being converted thereby into a baseband Q (quadrature) signal 139. The baseband I signal 138 and the baseband Q signal 139 have a quadrature relationship with each other.

A demodulator 101 receives the baseband I signal 138 and the baseband Q signal 139 from the low pass filters 136 and 137 respectively. The demodulator 101 combines the baseband I signal 138 and the baseband Q signal 139 into a baseband signal 102 representing transmission data carried by the received FSK radio signal.

Figure 4:
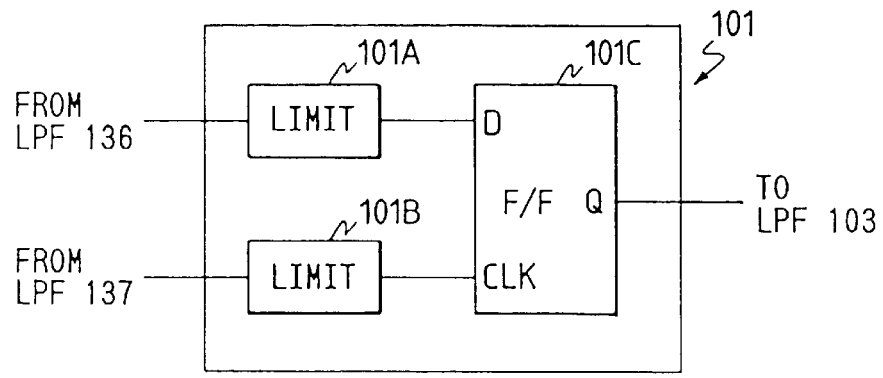
FIG. 4 is a block diagram of a demodulator in FIG. 3.

The demodulator 101 may be of one of known types. As shown in FIG. 4, an example of the demodulator 101 includes amplitude limiters (wave shapers) 101A and 101B and a D flip-flop 101C. The amplitude limiters 101A and 101B follow the low pass filters 136 and 137 respectively. The amplitude limiter 101A shapes the baseband I signal 138 into a corresponding rectangular waveform signal which is applied to the D input terminal of the D flip-flop 101C.

The amplitude limiter 101B shapes the baseband Q signal 139 into a corresponding rectangular waveform signal which is applied to the clock input terminal of the D flip-flop 101C. The D flip-flop 101C combines the applied rectangular waveform signals into a baseband signal 102 which appears at the Q output terminal thereof.

A frequency detector 104 receives the baseband I signal 138 and the baseband Q signal 139 from the low pass filters 136 and 137 respectively. The frequency detector 104 includes, for example, a combination of a mixer and a frequency difference sensor. The mixer combines the baseband I signal 138 and the baseband Q signal 139 into a composite signal. In the case where the frequency of the output signals of the local oscillator 134 and the 90° phase shifter 135 differs from the frequency of the carrier of a received FSK radio signal, the composite signal outputted from the mixer changes in frequency between a lower value and a higher value. The frequency difference sensor which follows the mixer senses the difference between the lower frequency and the higher frequency of the composite signal. The output signal of the frequency difference sensor is used as an output signal 105 of the frequency detector 104 which represents a baseband-signal frequency difference. Since the difference between the lower frequency and the higher frequency of the composite signal increases as the frequency of the output signals of the local oscillator 134 and the 90° phase shifter 135 differs from the frequency of the carrier of a received FSK radio signal by a greater degree, the output signal 105 of the frequency detector 104 represents the degree of the deviation of the frequency of the output signals of the local oscillator 134 and the 90° phase shifter 135 from the frequency of the carrier of the received FSK radio signal.

It should be noted that the frequency detector 104 may receive only one of the baseband I signal 138 and the baseband Q signal 139. In this case, the frequency detector 104 is designed to sense the difference between a lower frequency and a higher frequency of the baseband I signal 138 or the baseband Q signal 139.

A low pass filter 103 receives the baseband signal 102 from the demodulator 101, and removes high-frequency components from the received baseband signal 102. The output baseband signal of the low pass filter 103 is applied to a symbol deciding circuit 109.

The symbol deciding circuit 109 is followed by a decoder (not shown). In general, an FSK radio signal contains a sequence of a symbol sync signal (a bit sync signal) and a data signal. The decoder extracts the symbol sync signal (the bit sync signal) from an output signal 110 of the symbol deciding circuit 109.

A clock signal generator 106 receives the symbol sync signal (the bit sync signal) from the decoder, and generates a basic clock signal 107 in response to the symbol sync signal (the bit sync signal). The basic clock signal 107 provides a timing which corresponds to the center of every symbol period (every bit period). It should be noted that the clock signal generator 106 may be modified into a type directly responding to the output baseband signal of the low pass filter 103.

A variable delay device 108 receives the basic clock signal 107 from the clock signal generator 106. The variable delay device 108 also receives the output signal 105 of the frequency detector 104 which represents the baseband-signal frequency difference. The device 108 delays the basic clock signal 107 by a time dependent on the output signal 105 of the frequency detector 104, and thereby converts the basic clock signal 107 into a final clock signal.

The symbol deciding circuit 109 receives the final clock signal from the variable delay device 108. As previously described, the symbol deciding circuit 109 receives the baseband signal from the low pass filter 103. The symbol deciding circuit 109 samples and holds the baseband signal at a timing determined by the final clock signal, and outputs a demodulation-result signal 110.

Figure 5:
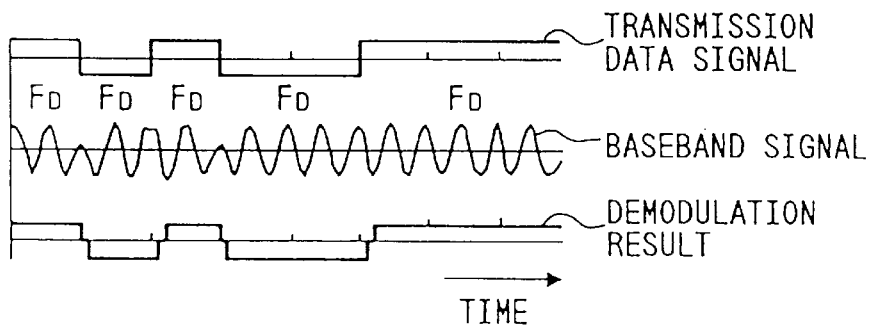
FIG. 5 is a diagram of the waveforms of signals in the direct-conversion receiver of FIG. 3.

FIG. 5 shows an example of the relation among a transmission data signal, a baseband I or Q signal, and a demodulation-result signal which occur under conditions where the frequency of the output signals of the local oscillator 134 and the 90° phase shifter 135 is equal to the frequency of the carrier of a received FSK radio signal. In this case, as shown in FIG. 5, the frequency of the baseband signal remains at a given constant value FD independent of the logic state of the transmission data signal. The given frequency FD corresponds to a frequency deviation of the FSK radio signal from its carrier.

Figure 6:
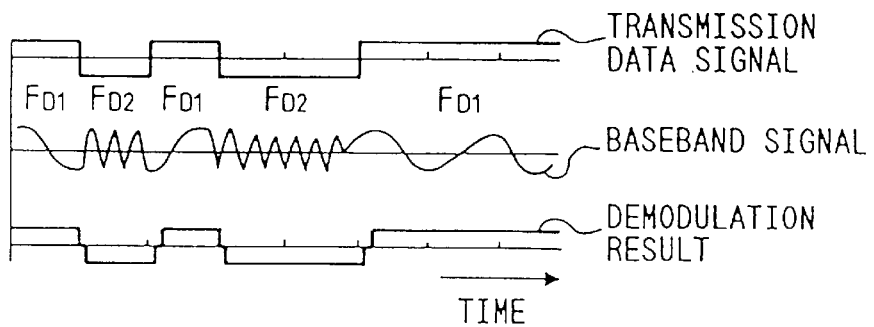
FIG. 6 is a diagram of the waveforms of signals in the direct-conversion receiver of FIG. 3.

FIG. 6 shows an example of the relation among a transmission data signal, a baseband I or Q signal, and a demodulation-result signal which occur under conditions where the frequency of the output signals of the local oscillator 134 and the 90° phase shifter 135 differs from the frequency of the carrier of a received FSK radio signal. In this case, as shown in FIG. 6, the frequency of the baseband signal changes between a lower frequency FD1 and a higher frequency FD2 in accordance with the logic state of the transmission data signal. The frequencies FD1 and FD2 are lower and higher than the given frequency FD (corresponding to a frequency deviation of the FSK radio signal) respectively.

Generally, the output signal 102 of the demodulator 101 delays from the received baseband I and Q signals 138 and 139 regarding the indication of the logic state of a data signal. The related delay time increases as the frequencies of the baseband I and Q signals 138 and 139 drop. In the case where the frequency of the output signals of the local oscillator 134 and the 90° phase shifter 135 differs from the frequency of the carrier of a received FSK radio signal, the frequency of the baseband I or Q signal periodically assumes a low value which causes a long delay time related to the output signal 102 of the demodulator 101. As will be made clear later, the direct-conversion receiver of this embodiment is designed to compensate for such a long delay time related to the output signal 102 of the demodulator 101.

As previously described, the basic clock signal 107 provides a timing which corresponds to the center of every symbol period (every bit period). The variable delay device 108 delays the basic clock signal 107 into the final clock signal by a time dependent on the output signal 105 of the frequency detector 104 which represents the degree of the deviation of the frequency of the output signals of the local oscillator 134 and the 90° phase shifter 135 from the frequency of the carrier of the received FSK radio signal. The symbol deciding circuit 109 receives the baseband signal from the low pass filter 103. The symbol deciding circuit 109 samples and holds the baseband signal at a timing determined by the final clock signal, and outputs a demodulation-result signal 110. As the deviation of the frequency of the output signals of the local oscillator 134 and the 90° phase shifter 135 from the frequency of the carrier of the received FSK radio signal increases, the final clock signal is more delayed from the basic clock signal 107 so that the timing of the sampling of the baseband signal by the symbol deciding circuit 109 more retards from the timing corresponding to the center of every symbol period. Accordingly, it is possible to compensate for a long delay time related to the output signal 102 of the demodulator 101. Thus, the demodulation-result signal 110 can be accurate.

Fourth Embodiment

A direct-conversion receiver of a fourth embodiment of this invention is similar to the direct-conversion receiver of FIG. 3 except that the variable delay device 108 (see FIG. 3) is replaced by a fixed delay device and the frequency detector 104 (see FIG. 3) is omitted. In the fourth embodiment, the fixed delay device delays the basic clock signal 107 (see FIG. 3) into a final clock signal by a predetermined time, and outputs the final clock signal to a symbol deciding circuit 109 (see FIG. 3).

Figure 7:
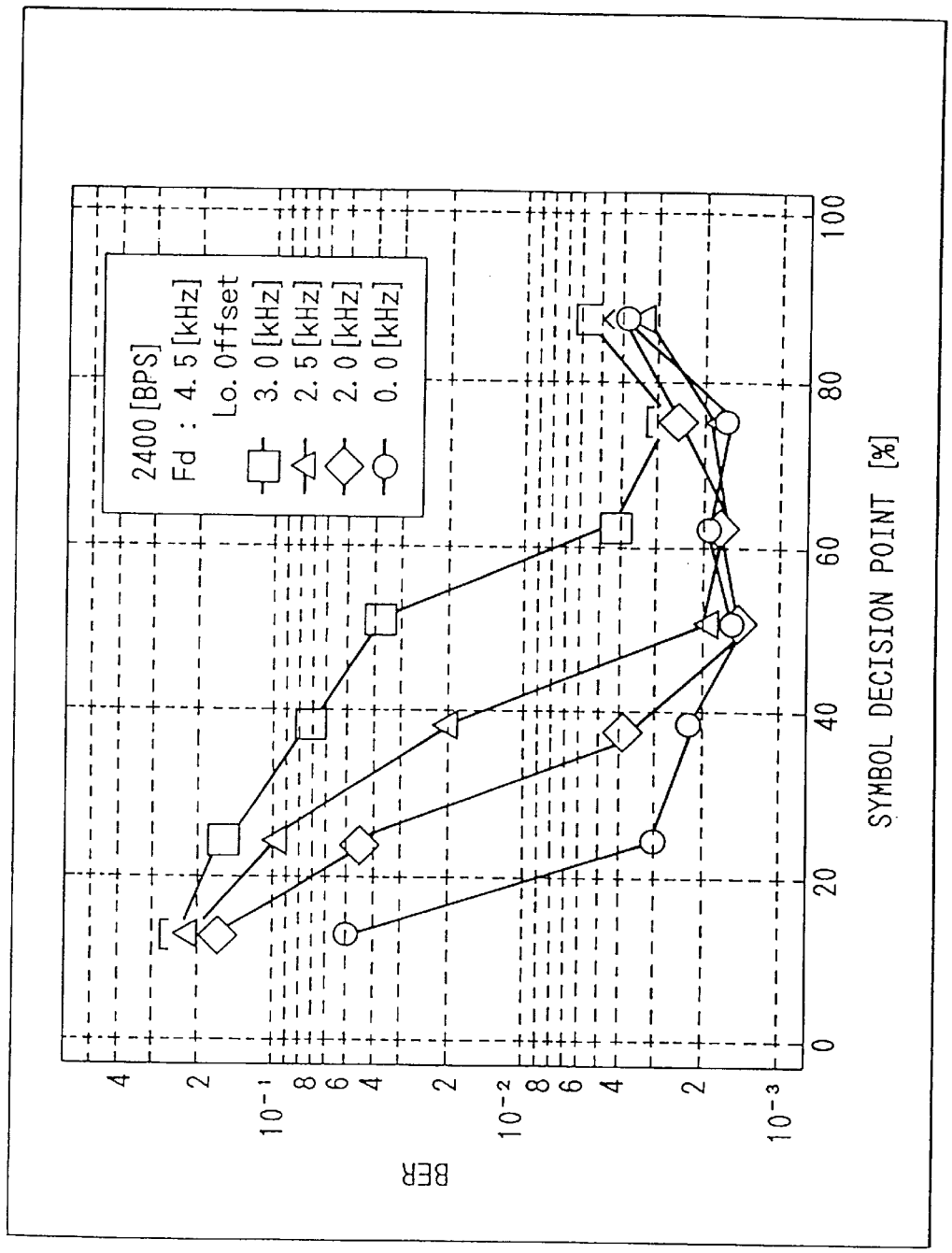
FIG. 7 is a diagram showing a simulation result of the behavior of a direct-conversion receiver according to a fourth embodiment of this invention.

FIG. 7 shows a result of simulation of the behavior of the direct-conversion receiver in this embodiment which was executed by using a computer. During the simulation, the delay time provided by the delay device was varied to change the timing of the sampling of a baseband signal by the symbol deciding circuit 109. The timing of the sampling of a baseband signal by the symbol deciding circuit 109 was expressed in unit of % as follows. The sample timing which coincided with the start of every symbol period was expressed as 0%. The sample timing which coincided with the center of every symbol period was expressed as 50%. The sample timing which coincided with the end of every symbol period was expressed as 100%. During the simulation, the deviation of the frequency of the output signals of a local oscillator 134 (see FIG. 3) and a 90° phase shifter 135 (see FIG. 3) from the frequency of the carrier of a received FSK radio signal was changed among 0.0 kHz, 2.0 kHz, 2.5 kHz, and 3.0 kHz. In addition, a bit error rate (BER) of symbol decision was calculated.

In view of the simulation result shown by FIG. 7, it is preferable that the sample timing is between 51% and 90%. It is most preferable that the sample timing is between 65% and 75%.

Fifth Embodiment

Figure 8:
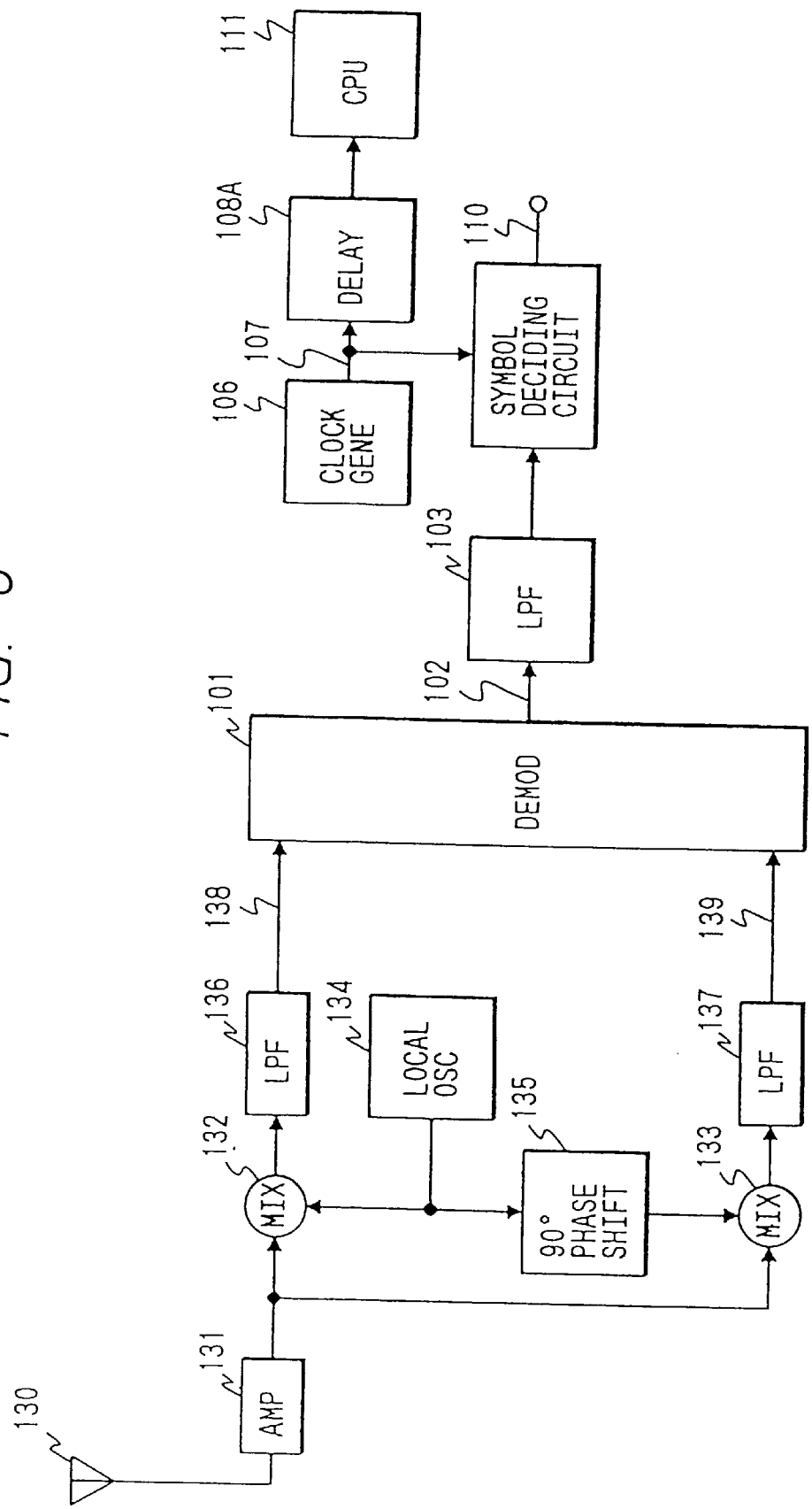
FIG. 8 is a block diagram of a direct-conversion receiver according to a fifth embodiment of this invention.

FIG. 8 shows a direct-conversion receiver according to a fifth embodiment of this invention which is similar to the embodiment of FIG. 3 except for design changes indicated hereinafter.

The frequency detector 104 (see FIG. 3) and the variable delay device 108 (see FIG. 3) are omitted from the embodiment of FIG. 8. A clock signal generator 106 outputs a basic clock signal 107 directly to a symbol deciding circuit 109 in the embodiment of FIG. 8. In addition, a delay device 108A receives the basic clock signal 107 from the clock signal generator 106. This device 108A delays the basic clock signal 107 by a predetermined time, and thereby converts the basic clock signal 107 into a second clock signal.

A decoder (not shown) processes a demodulation-result signal 110 generated from the symbol deciding circuit 109. A CPU 111 processes an output signal of the decoder in accordance with a predetermined program. During the execution of a segment of the program, the CPU 111 generates high-level noise which tends to interfere with operation of the symbol deciding circuit 109.

The delay device 108A feeds the second clock signal to the CPU 111 as a trigger pulse for starting the execution of the program segment which causes high-level noise. The execution of the program segment is completed in an extremely short time relative to a symbol period (a bit period).

The delay device 108A staggers or delays the timing of the sampling of a baseband signal by the symbol deciding circuit 109 from the timing of the execution of the program segment by the CPU 111. Accordingly, noise caused by the CPU 111 during the execution of the program segment is prevented from interfering with the signal sampling process by the symbol deciding circuit 109. Thus, the demodulation-result signal 110 can be accurate.

Figure 9:
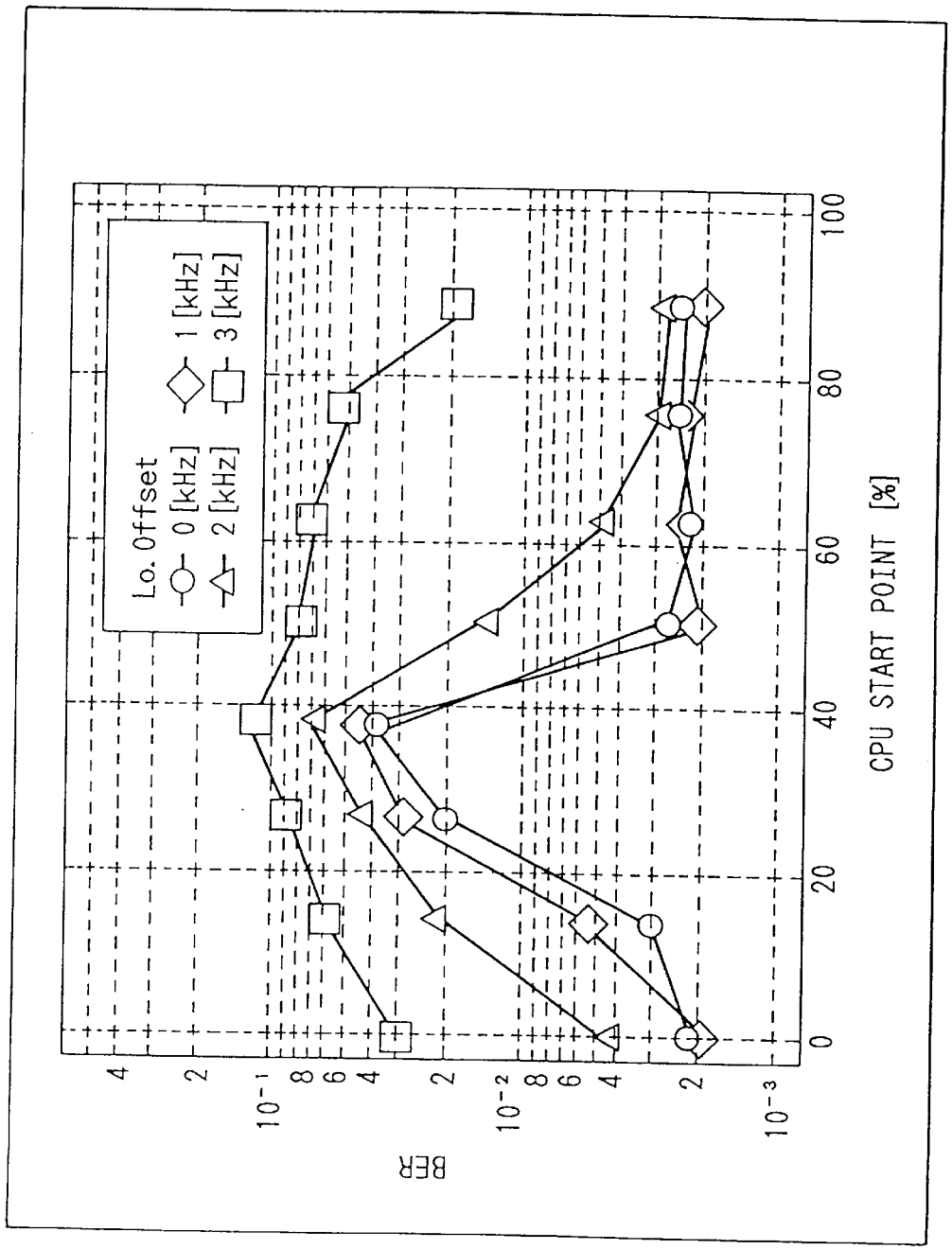
FIG. 9 is a diagram showing a simulation result of the behavior of the direct-conversion receiver in FIG. 8.

FIG. 9 shows a result of simulation of the behavior of the direct-conversion receiver in this embodiment which was executed by using a computer. During the simulation, the delay time provided by the delay device 108A was varied to change the timing of the execution of the program segment by the CPU 111. The timing of the execution of the program segment by the CPU 111 was expressed in unit of % as follows. The execution timing which coincided with the start of every symbol period was expressed as 0%. The execution timing which coincided with the center of every symbol period was expressed as 50%. The execution timing which coincided with the end of every symbol period was expressed as 100%. During the simulation, the deviation of the frequency of the output signals of a local oscillator 134 and a 90° phase shifter 135 from the frequency of the carrier of a received FSK radio signal was changed among 0.0 kHz, 1.0 kHz, 2.0 kHz, and 3.0 kHz. In addition, a bit error rate (BER) of symbol decision was calculated. During the simulation, the timing of the sampling of a baseband signal by the symbol deciding circuit 109 was fixed to 50%. As shown in FIG. 9, the calculated bit error rate (BER) decreased as the timing of the execution of the program segment by the CPU 111 was distant from a point around 50%.

The delay device 108A may be connected between the clock signal generator 106 and the symbol deciding circuit 109. In this case, the clock signal generator 106 feeds the basic clock signal 107 directly to the CPU 111 as a trigger pulse.

Sixth Embodiment

Figure 10:
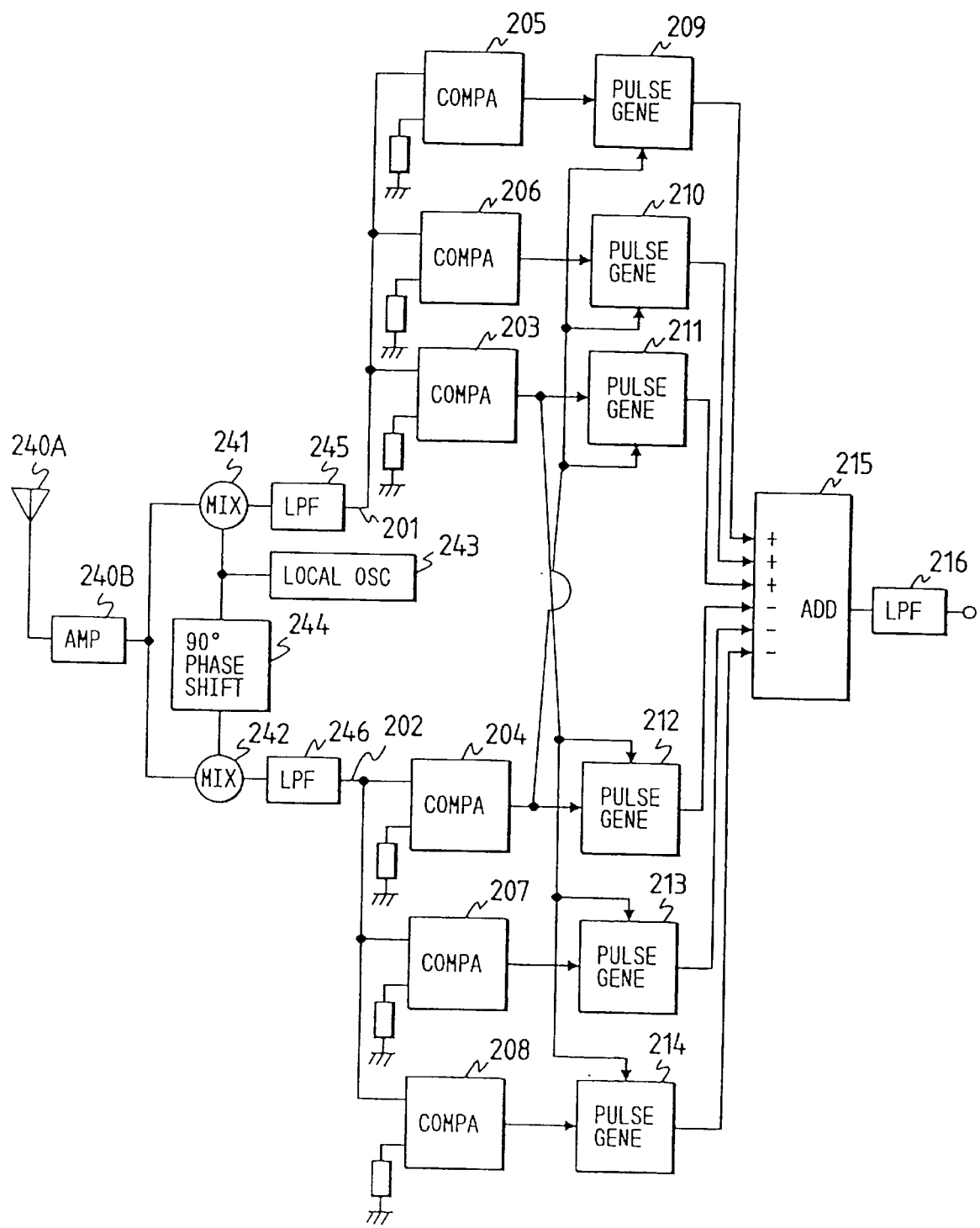
FIG. 10 is a block diagram of a direct-conversion receiver according to a sixth embodiment of this invention.

With reference to FIG. 10, a direct-conversion receiver of a sixth embodiment of this invention includes an antenna 240A for catching an FSK radio signal. The antennal 240A is followed by an RF amplifier 240B. The received FSK radio signal is fed from the antenna 240A to mixers 241 and 242 via the amplifier 240B.

A local oscillator 243 outputs a signal having a frequency set to the frequency of a carrier of an FSK radio signal. The output signal of the local oscillator 243 is applied to the mixer 241. The output signal of the local oscillator 243 is also applied to a 90° phase shifter 244, being converted thereby into a 90° phase shifted signal. Thus, the output signal of the local oscillator 243 and the output signal of the 90° phase shifter 244 have a quadrature relationship with each other. The output signal of the 90° phase shifter 244 is applied to the mixer 242.

The mixer 241 down-converts the received FSK radio signal in response to the output signal of the local oscillator 243. The output signal of the mixer 241 is processed by a low pass filter 245, being converted thereby into a baseband I (in-phase) signal 201.

The mixer 242 down-converts the received FSK radio signal in response to the output signal of the 90° phase shifter 244. The output signal of the mixer 242 is processed by a low pass filter 246, being converted thereby into a baseband Q (quadrature) signal 202. The baseband I signal 201 and the baseband Q signal 202 have a quadrature relationship with each other.

Amplitude limiters or comparators 203, 205, and 206 receive the baseband I signal 201 from the low pass filter 245. The comparators 203, 205, and 206 convert the baseband I signal 201 into corresponding bi-level signals or rectangular waveform signals by comparing the level of the baseband I signal 201 with predetermined threshold levels. The threshold levels used by the comparators 205 and 206 are higher and lower than the threshold level used by the comparator 203 respectively.

Amplitude limiters or comparators 204, 207, and 208 receive the baseband Q signal 202 from the low pass filter 246. The comparators 204, 207, and 208 convert the baseband Q signal 202 into corresponding bi-level signals or rectangular waveform signals by comparing the level of the baseband Q signal 202 with predetermined threshold levels. The threshold levels used by the comparators 207 and 208 are higher and lower than the threshold level used by the comparator 204 respectively.

Pulse generators 209, 210, and 211 receive the output signal of the comparator 204 as a reference phase signal. The pulse generators 209, 210, and 211 receive the output signals of the comparators 205, 206, and 203 respectively. The pulse generators 209, 210, and 211 produce pulses of a given small width in response to changes in levels of the output signals of the comparators 205, 206, and 203 respectively. The polarities of the pulses produced by the pulse generators 209, 210, and 211 depend on the level of the reference phase signal (the output signal of the comparator 204).

Pulse generators 212, 213, and 214 receive the output signal of the comparator 203 as a reference phase signal. The pulse generators 212, 213, and 214 receive the output signals of the comparators 204, 207, and 208 respectively. The pulse generators 212, 213, and 214 produce pulses of a given small width in response to changes in levels of the output signals of the comparators 204, 207, and 208 respectively. The polarities of the pulses produced by the pulse generators 212, 213, and 214 depend on the level of the reference phase signal (the output signal of the comparator 203).

Figure 11:
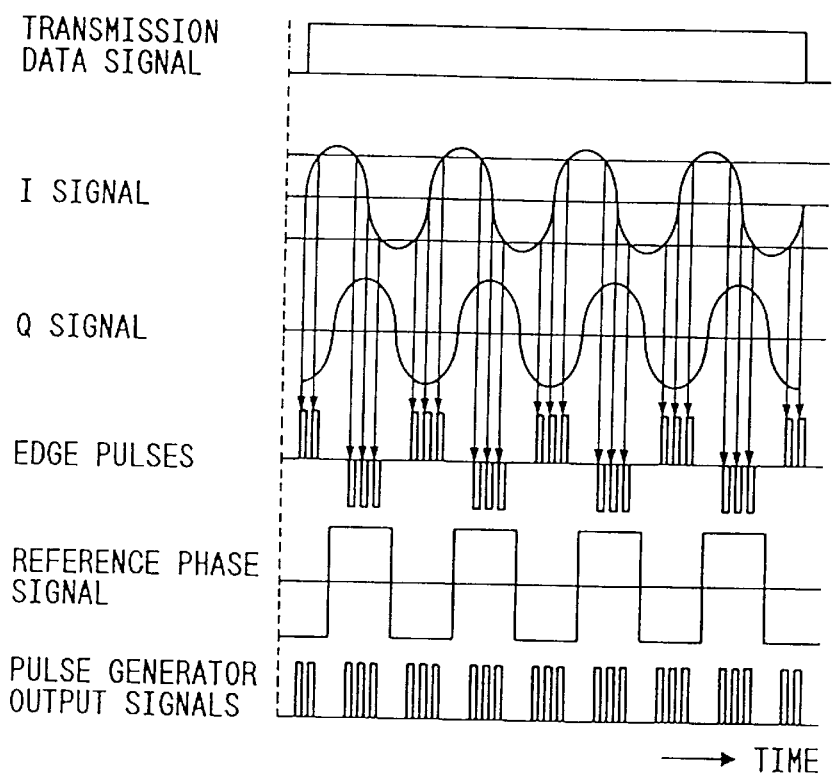
FIG. 11 is a diagram of the waveforms of signals in the direct-conversion receiver of FIG. 10.
Figure 12:
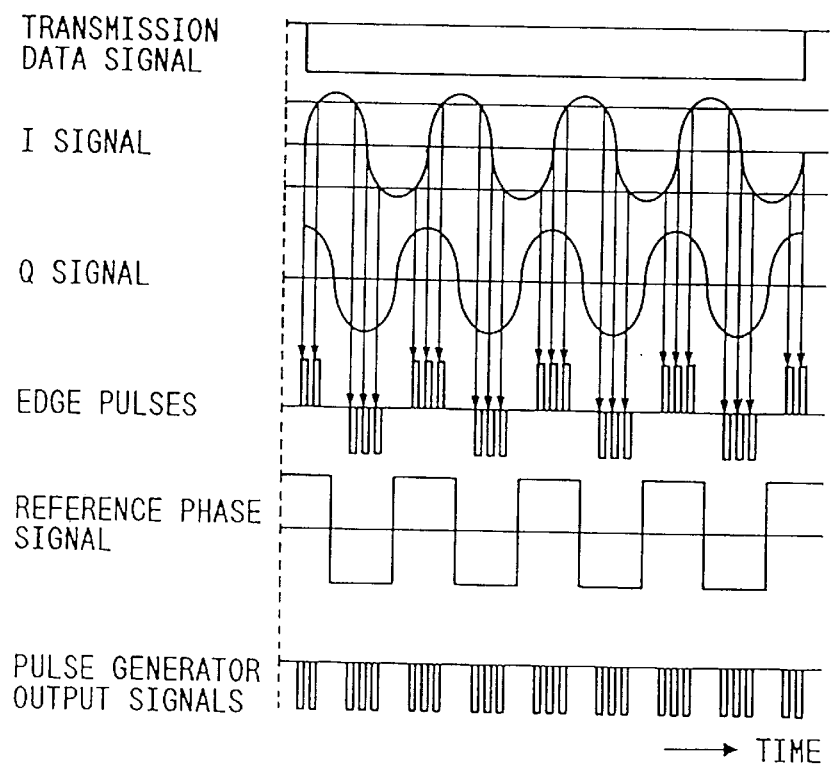
FIG. 12 is a diagram of the waveforms of signals in the direct-conversion receiver of FIG. 10.

FIG. 11 shows the waveforms of the baseband I signal 201 and the baseband Q signal 202 which occur when a transmission data signal remains "mark", that is, "1". FIG. 12 shows the waveforms of the baseband I signal 201 and the baseband Q signal 202 which occur when a transmission data signal remains "space", that is, "0".

With reference to FIGS. 11 and 12, the pulse generators 209, 210, and 211 produce positive-polarity edge pulses of a given small width in response to rising edges in the output signals of the comparators 205, 206, and 203 respectively. The pulse generators 209, 210, and 211 produce negative-polarity edge pulses of a given small width in response to falling edges in the output signals of the comparators 205, 206, and 203 respectively. During a period where the reference phase signal (the output signal of the comparator 204) remains a low level or "0", the pulse generators 209, 210, and 211 output the produced positive-polarity and negative-polarity edge pulses as they are. During a period where the reference phase signal (the output signal of the comparator 204) remains a high level or "1", the pulse generators 209, 210, and 211 invert the produced positive-polarity edge pulses into negative-polarity edge pulses and invert the produced negative-polarity edge pulses into positive-polarity edge pulses, and then the pulse generators 209, 210, and 211 output the resultant negative-polarity and positive-polarity edge pulses.

The pulse generators 212, 213, and 214 are similar in operation to the pulse generators 209, 210, and 211. The structures of the pulse generators 209, 210, 211, 212, 213, and 214 are similar to each other. Only the structure of the pulse generator 209 will now be described in detail.

Figure 13:
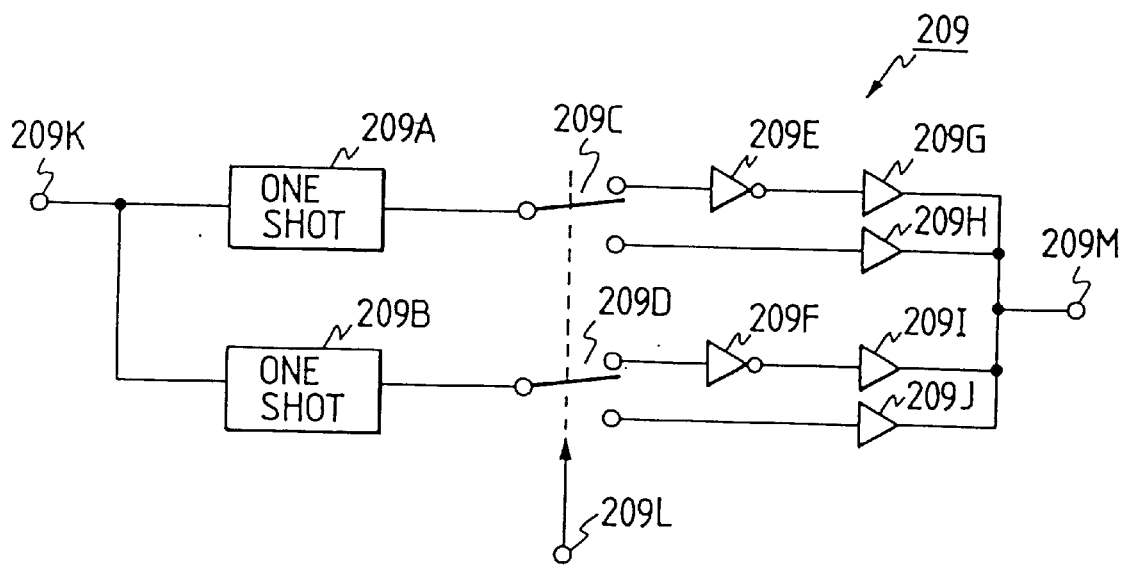
FIG. 13 is a block diagram of a first example of a pulse generator in FIG. 10.

As shown in FIG. 13, the pulse generator 209 includes one-shot multivibrators 209A, 209B, switches 209C and 209D, inverters 209E and 209F, and buffers 209G, 209H, 209I, and 209J. The one-shot multivibrators 209A and 209B receive the output signal of the comparator 205 (see FIG. 10) via an input terminal 209K. The one-shot multivibrator 209A generates a positive-polarity pulse of a given width in response to a rising edge in the output signal of the comparator 205 (see FIG. 10). The one-shot multivibrator 209B generates a negative-polarity pulse of a given width in response to a falling edge in the output signal of the comparator 205 (see FIG. 10). The one-shot multivibrator 209A outputs the generated positive-polarity pulse to the switch 209C. The one-shot multivibrator 209B outputs the generated negative-polarity pulse to the switch 209D. The switches 209C and 209D receive the reference phase signal, that is, the output signal of the comparator 204 (see FIG. 10), via a control terminal 209L. When the reference phase signal assumes a high level or "1", the switch 209C transmits the positive-polarity pulse from the one-shot multivibrator 209A to the inverter 209E. In this case, the inverter 209E changes the received positive-polarity pulse to a negative-polarity pulse, and outputs the negative-polarity pulse to the buffer 209G. When the reference phase signal assumes a low level or "0", the switch 209C transmits the positive-polarity pulse from the one-shot multivibrator 209A to the buffer 209H. When the reference phase signal assumes a high level or "1", the switch 209D transmits the negative-polarity pulse from the one-shot multivibrator 209B to the inverter 209F. In this case, the inverter 209F changes the received negative-polarity pulse to a positive-polarity pulse, and outputs the positive-polarity pulse to the buffer 209I. When the reference phase signal assumes a low level or "0", the switch 209D transmits the negative-polarity pulse from the one-shot multivibrator 209B to the buffer 209J. The buffers 209G, 209H, 209I, and 209J transmit the received positive-polarity and negative-polarity pulses to an output terminal 209M which is connected to an adder 215 (see FIG. 10).

Figure 14:
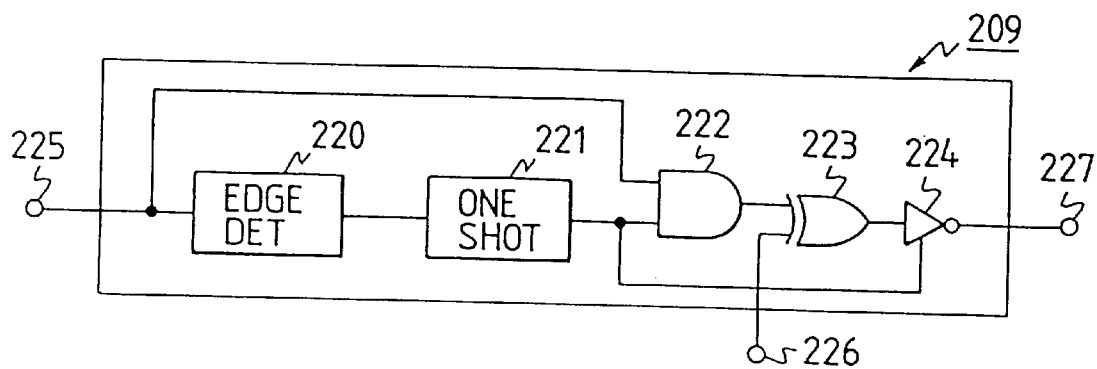
FIG. 14 is a block diagram of a second example of a pulse generator in FIG. 10.

FIG. 14 shows an alternative structure of the pulse generator 209. As shown in FIG. 14, the pulse generator 209 includes an edge detector 220, a one-shot multivibrator 221, an AND circuit 222, an Exclusive-OR circuit 223, and a three-state NOT circuit 224. The edge detector 220 receives the output signal of the comparator 205 (see FIG. 10) via an input terminal 225. The edge detector 220 generates a pulse in response to each of a rising edge and a falling edge in the output signal of the comparator 205 (see FIG. 10), and outputs the generated pulse to the one-shot multivibrator 221. The one-shot multivibrator 221 generates a positive-polarity pulse of a given width in response to the output pulse from the edge detector 220. The one-shot multivibrator 221 outputs the generated pulse to a first input terminal of the AND circuit 222 and a control terminal of the three-state NOT circuit 224. A second input terminal of the AND circuit 222 receives the output signal of the comparator 205 (see FIG. 10) via the input terminal 225. A high-level output signal of the AND circuit 222 which occurs during the reception of the pulse from the one-shot multivibrator 221 represents the detection of a rising edge in the output signal of the comparator 205. A low-level output signal of the AND circuit 222 which occurs during the reception of the pulse from the one-shot multivibrator 221 represents the detection of a falling edge in the output signal of the comparator 205. A first input terminal of the Exclusive-OR circuit 223 receives the output signal of the AND circuit 222. A second input terminal of the Exclusive-OR circuit 223 receives the reference phase signal, that is, the output signal of the comparator 204 (see FIG. 10), via a control terminal 226. When the output signal of the AND circuit 222 and the reference phase signal are different from each other in logic state, the Exclusive-OR circuit 223 outputs a high-level signal to the input terminal of the three-state NOT circuit 224. Otherwise, the Exclusive-OR circuit 223 outputs a low-level signal to the input terminal of the three-state NOT circuit 224. When the output signal of the one-shot multivibrator 221 assumes a high level, the three-state NOT circuit 224 inverts the output signal of the Exclusive-OR circuit 223 and transmits the resultant signal to an output terminal 227. When the output signal of the one-shot multivibrator 221 assumes a low level, the output terminal of the three-state NOT circuit 224 falls into a high-impedance state so that the three-state NOT circuit 224 inhibits the transmission of the output signal of the Exclusive-OR circuit 223 to the output terminal 227. The output terminal 227 is connected to the adder 215 (see FIG. 10).

As shown in FIG. 10, the adder 215 receives the output signals of the pulse generators 209, 210, 211, 212, 213, and 214, and combines the received signals. Specifically, the device 215 adds the output signals of the pulse generators 209, 210, and 211 and the inversions of the output signals of the pulse generators 212, 213, and 214. A low pass filter 216 which follows the adder 215 processes the output signal of the adder 215 into a demodulation-result signal.

Seventh Embodiment

Figure 15:
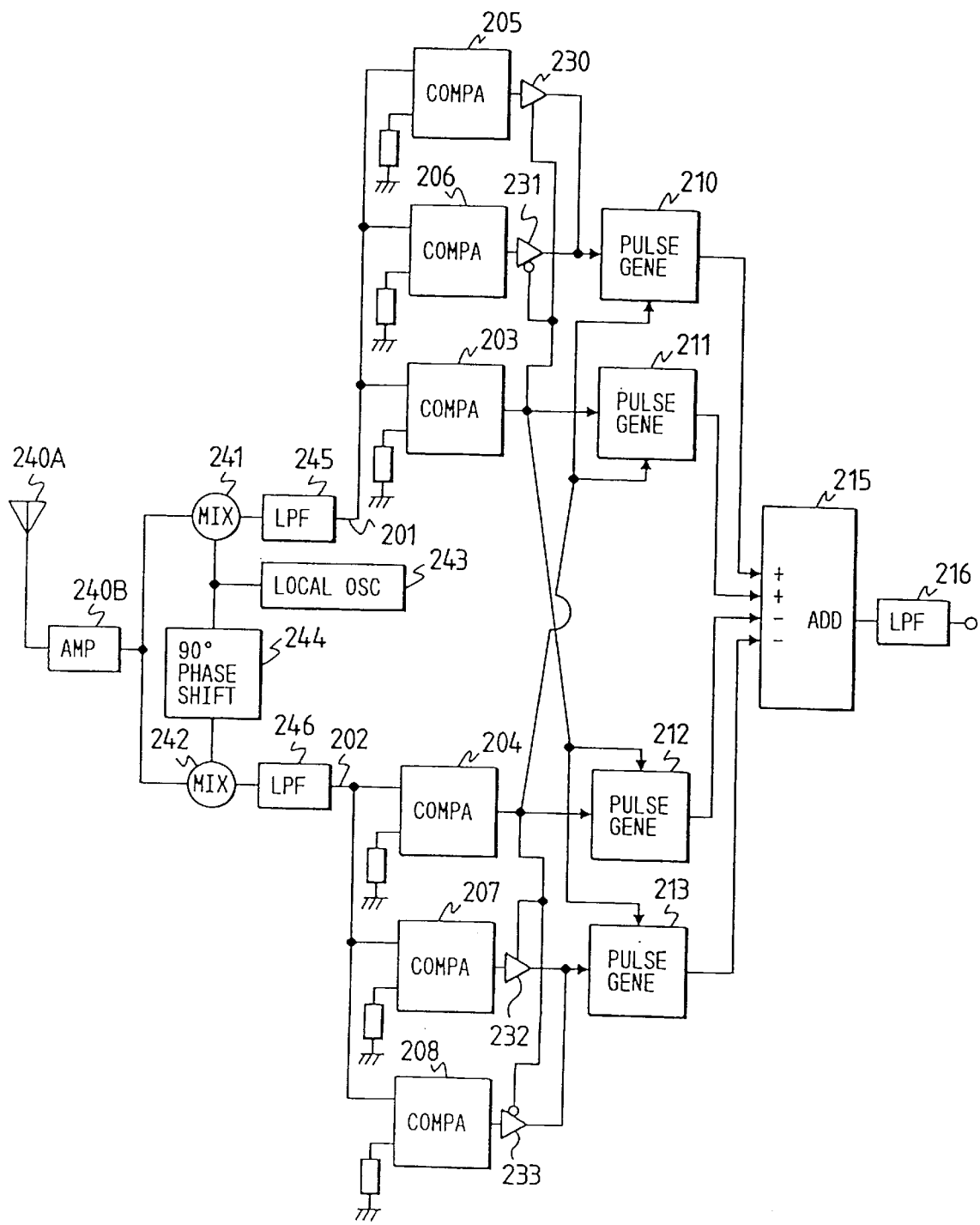
FIG. 15 is a block diagram of a direct-conversion receiver according to a seventh embodiment of this invention.

FIG. 15 shows a direct-conversion receiver according to a seventh embodiment of this invention which is similar to the direct-conversion receiver of FIG. 10 except that three-state circuits 230, 231, 232, and 233 are added while the pulse generators 209 and 214 (see FIG. 10) are omitted.

As shown in FIG. 15, the three-state circuit 230 is connected between the output terminal of a comparator 205 and the input terminal of a pulse generator 210. The three-state circuit 231 is interposed between the output terminal of a comparator 206 and the input terminal of the pulse generator 210. The three-state circuit 232 is interposed between the output terminal of a comparator 207 and the input terminal of a pulse generator 213. The three-state circuit 233 is connected between the output terminal of a comparator 208 and the input terminal of the pulse generator 213.

The three-state circuits 230 and 231 are controlled by the output signal of the comparator 203. When the output signal of the comparator 203 assumes a high level, the three-state circuit 230 allows the transmission of the output signal of the comparator 205 to the pulse generator 210 but the three-state circuit 231 inhibits the transmission of the output signal of the comparator 206 to the pulse generator 210. When the output signal of the comparator 203 assumes a low level, the three-state circuit 230 inhibits the transmission of the output signal of the comparator 205 to the pulse generator 210 but the three-state circuit 231 allows the transmission of the output signal of the comparator 206 to the pulse generator 210.

The three-state circuits 232 and 233 are controlled by the output signal of the comparator 204. When the output signal of the comparator 204 assumes a high level, the three-state circuit 232 allows the transmission of the output signal of the comparator 207 to the pulse generator 213 but the three-state circuit 233 inhibits the transmission of the output signal of the comparator 208 to the pulse generator 213. When the output signal of the comparator 204 assumes a low level, the three-state circuit 232 inhibits the transmission of the output signal of the comparator 207 to the pulse generator 213 but the three-state circuit 233 allows the transmission of the output signal of the comparator 208 to the pulse generator 213.

What is claimed is:

1. A direct-conversion receiver comprising:

a local oscillator for generating a local oscillator signal;

means for converting a received radio signal into a pair of a baseband I signal and a baseband Q signal in response to the local oscillator signal;

a demodulator for demodulating the pair of the baseband I signal and the baseband Q signal into a demodulation-resultant signal which is neither an I signal nor a Q signal;

means for detecting a difference between a frequency of the local oscillator signal and a frequency of a carrier of the received radio signal;

a clock signal generator for generating a first clock signal providing a timing which corresponds to a center of a symbol period;

a signal delay device for delaying the first clock signal in response to the detected frequency difference, and thereby converting the first clock signal into a second clock signal; and means for deciding a logic state of the demodulation-resultant signal at a timing determined by the second clock signal.

2. A direct-conversion receiver for a radio signal carrying information, comprising:

first means for receiving the radio signal;

a local oscillator outputting a signal having a frequency which is designed to correspond to a frequency of a carrier of the radio signal;

a phase shifter for shifting a phase of the output signal of the local oscillator by 90°;

mixers for mixing the radio signal received by the first means, the output signal of the local oscillator, and an output signal of the phase shifter, and down-converting the radio signal into a pair of a baseband I signal and a baseband Q signal representing the information;

a demodulator for demodulating the pair of the baseband I signal and the baseband Q signal into a demodulation-resultant signal which is neither an I signal nor a Q signal;

second means for detecting a difference between the frequency of the output signal of the local oscillator and the frequency of the carrier of the radio signal received by the first means; and third means for deciding a logic state of the demodulation-resultant signal at a timing which depends on the frequency difference detected by the second means.

* * * * *